US007026228B1

(12) United States Patent
Hails et al.

(10) Patent No.: US 7,026,228 B1
(45) Date of Patent: Apr. 11, 2006

(54) METHODS OF FABRICATING DEVICES AND SEMICONDUCTOR LAYERS COMPRISING CADMIUM MERCURY TELLURIDE, MERCURY TELLURIDE, AND CADMIUM TELLURIDE

(75) Inventors: Janet E. Hails, Malvern (GB); John Stevenson, deceased, late of Fife (GB); by Saamara N. Turney, legal representative, Yelvertoft (GB); David J. Cole-Hamilton, Fife (GB); William Bell, Falkirk (GB); Douglas F. Foster, Fife (GB)

(73) Assignee: QinetiQ Limited, Hants (GB)

( * ) Notice: Subject to any disclaimer, the term of this patent is extended or adjusted under 35 U.S.C. 154(b) by 187 days.

(21) Appl. No.: 10/088,026

(22) PCT Filed: Aug. 22, 2000

(86) PCT No.: PCT/GB00/03249

§ 371 (c)(1),
(2), (4) Date: Oct. 8, 2003

(87) PCT Pub. No.: WO01/20687

PCT Pub. Date: Mar. 22, 2001

(30) Foreign Application Priority Data

Sep. 15, 1999 (GB) ................. 9921639

(51) Int. Cl.
H01L 21/36 (2006.01)
H01L 21/20 (2006.01)
H01L 21/00 (2006.01)
H01L 31/00 (2006.01)
B05D 5/12 (2006.01)

(52) U.S. Cl. ............... 438/509; 438/93; 438/94; 438/95; 257/442; 427/76

(58) Field of Classification Search ............ 438/38, 438/57, 93, 94, 95, 509; 257/188, 431, 442; 427/58, 74, 76
See application file for complete search history.

(56) References Cited

U.S. PATENT DOCUMENTS 4,566,918 A * 1/1986 Irvine et al. ............... 438/509
4,804,638 A 2/1989 Hoke et al.
5,124,481 A 6/1992 Higa et al.
5,189,297 A * 2/1993 Ahlgren ................ 250/214.1

FOREIGN PATENT DOCUMENTS

EP 0 045 258 A 2/1982
EP 0 285 834 A 10/1988
EP 0 285 834 A1 10/1988
EP 0 525 881 A 2/1993
GB 2 249 790 A 5/1992

(Continued)

OTHER PUBLICATIONS

R. Morrison and R. Boyd, Organic Chemistry, Fourth Edition, Allyn and Bacon, 1983, p. 21.*

(Continued)

Primary Examiner—David Blum
Assistant Examiner—Heather Doty
(74) Attorney, Agent, or Firm—Nixon & Vanderhye P.C.

(57) ABSTRACT

The invention relates to a method of depositing $Hg_{1-x}Cd_xTe$ onto a substrate, in a MOVPE technique, where $0 \leq x \leq 1$; comprising the step of reacting together a volatile organotellurium compound, and one or both of (i) a volatile organocadmium compound and (ii) mercury vapour; characterised in that the organotellurium compound is isopropylallyltelluride. The invention also relates to devices, such as infrared sensors and solar cells, that comprise $Hg_{1-x}Cd_xTe$ materials.

11 Claims, 3 Drawing Sheets

FOREIGN PATENT DOCUMENTS

WO            90 15796 A     12/1990

OTHER PUBLICATIONS

Database Chemical Abstract Online, Columbus, Ohio; Abstract No. 112:97989; Jul. 9, 1989, Gedridge, R et al.; "New Organotellurium Precursors for the Pyrolytic and Photolytic Deposition of Mercury Cadmium Telluride", XP002153037.

J.E. Hails et al; "Methyl(Allyl)Telluride as a Te Precursor for Growth of (Hg,Cd) Te by Metal Organic Vapour Phase Epitaxy", Journal of Crystal Growth, vol. 145, No. 1-4, Dec. 1994, pp. 596-601, XP002153036.

Hails et al; "Screening of Organotellurium Compounds for Use as MOVPE Precursors", Journal of Crystal Growth, NL, North-Holland Publishing Co. Amsterdam, vol. 107, No. 1 / 4, 1991, pp. 319-324, XP000245842.

Patent Abstract of Japan, vol. 012, No. 072 (E-588), Mar. 5, 1988 & JP 62 214626 A, Sep. 21, 1987.

Hails et al; "Allyl-Iso-Propyltelluride, a New MOVPE Precursor for CdTe, HgTe and (HgCd)Te"; Journal of Crystal Growth, North-Holland Publishing Co. Amsterdam, NL, vol. 214-215, Jun. 2000, pp. 45-49, XP004200961.

Gedridge, R. et al; "$^{125}$Te, $^{13}$C and $^1$H NMR Characterization of a Series of Diorganotellurium (II) and Tetraorganotellurium (IV) Compounds", Magnetic Resonance In Chemistry, vol. 33, 1995, pp. 441-448.

Kirss et al; "Ligand-Exchange Reactions in Organotellurides by $^{125}$Te NMR Spectroscopy", American Chemical Society, Organometallics 1991, 10, 3597-3599.

Gedridge et al; "New Organotellurium Precursors for the Pyrolytic and Photolytic Deposition of $Hg_{1-x}Cd_xTe$", Mat. Res. Soc. Symp. Proc., vol 131, 1989, pp. 69-73.

Hails et al; "A Chemical Assessment of the Suitability of Allyl-Iso-Propyltelluride as a Te Precursor for Metal Organic Vapour Phase Epitaxy"; School of Chemistry, University of St. Andrews, UK, p. 1-15 (including figures).

* cited by examiner

METHODS OF FABRICATING DEVICES AND SEMICONDUCTOR LAYERS COMPRISING CADMIUM MERCURY TELLURIDE, MERCURY TELLURIDE, AND CADMIUM TELLURIDE

This application is the US national phase of international application PCT/GB00/03249 filed 22 Aug. 2000, which designated the US.

The invention relates to a new methods of fabricating cadmium mercury telluride, mercury telluride, and cadmium telluride using isopropylallyltelluride as a precursor, by deposition on a substrate. The invention also relates to new devices comprising cadmium mercury telluride, mercury telluride, and cadmium telluride, and to methods of fabricating such devices. Finally, the invention relates to a new synthesis for isopropylallyltelluride.

Cadmium mercury telluride (CMT), mercury telluride (MT), and cadmium telluride (CT) are used in a number of electronic devices including infrared detectors. Cadmium telluride is also used in solar cells. These materials have the general formula: $Hg_{1-x}Cd_xTe$ where $0 \leq x \leq 1$. If $x=1$ then the material is cadmium telluride, if $x=0$ then the material is mercury telluride, if $0<x<1$ then the material is cadmium mercury telluride.

These telluride materials are commonly grown by metal organic vapour phase epitaxy (MOVPE) from organotellurium precursors. In the case of CMT an organocadmium compound, typically dimethylcadmium, and an organotellurium compound are heated with mercury in the vapour phase. The arrangement and conditions are such that the organometallic compounds react with each other, decompose, and react with the mercury resulting in deposition of CMT on a substrate.

The choice of the organotelluride used is critical to the production of these materials and devices.

There are a large number of organotellurium compounds that might be of value in deposition of CT/CMT/MT by MOVPE. One variant is that the organo groups could include alkyl, alkenyl, or aryl groups. Another variant is that compounds having organo groups in the range $C_1$ to $C_6$ are all potential candidates as precursors. Yet another variant is the fact that the telluride may be symmetric or unsymmetric. Structural isomers add a final multiplier to the number of possible compounds that are candidates as MOVPE precursors.

A number of factors affect the suitability of an organotelluride as an MOVPE precursor.

The decomposition temperature of the organotelluride should be sufficiently low that the CMT, MT, and CT materials can be grown efficiently, but not so low that the organotelluride compound decomposes at relatively low temperatures. If the decomposition temperature is too low then this could present problems with regard to storage and handling of the organotelluride. The organotelluride should be sufficiently volatile that the material can be transported around the equipment in which the CT, CMT, and MT is to be grown. However, if the organotelluride is too volatile then this can cause problems with storage and handling, for example the organotelluride may have to be cooled or maintained under pressure.

The decomposition temperature and volatility of the organotelluride affects the temperature at which MOVPE can be carried out. Preferably this MOVPE growth temperature for CMT should be lower than 370° C. Preferably the MOVPE growth temperature for CT should be lower than 350° C., for MT it should be lower than 370° C. The temperature should be relatively low for these materials for a number of reasons. The use of low temperatures results in lower concentration of Hg vacancies in the CMT material. This results in lower carrier concentrations and reduces the need for annealing to remove such vacancies. Lower temperatures would also reduce diffusion of dopant elements in complex structures leading to more abrupt interfaces.

The first step in the decomposition of organotellurium compounds is thought to be the homolytic cleavage of a Te—C bond. This mechanism means that the generation of undesirable by-products, as a result of reactions involving free radicals, is a problem for some organotellurium compounds. The telluride should therefore be chosen to minimise such by-products.

A number of factors affect the decomposition temperature, volatility, MOVPE temperature and generation of by-products.

Bulky high molecular weight organo groups often result in a low decomposition temperature for the organotellurium compound. This factor must be weighed against the fact that high molecular weight organotellurium compounds often have a low volatility. The decomposition temperature is also affected by the stability of the free radical resulting from homolytic cleavage. Stabilisation might occur as a result of delocalisation of the free radical across the whole molecule. This would suggest groups such as $CH_2$=$CHCH_2$ or $CH_2$=$CHCH$=$CHCH_2$ would be suitable. The presence of dimethylcadmium can also affect the decomposition temperature of the organotellurium compound.

The above illustrates that there are quite a large number of conflicting factors that affect which of the many organotellurium compounds would be suitable. The complexity of this chemical system is illustrated by comparing the properties of diisopropyltelluride, diallyltelluride, and methylallyltelluride.

Diisopropyltelluride is probably the precursor most commonly used for the growth of CT and CMT. The MOVPE growth temperature using the diisopropyl compound and dimethylcadmium is typically 370° C. for CMT. It might be thought that diallyltelluride would be an ideal precursor for CMT since it has a similar molecular weight to the diisopropyl compound but should yield a stable free radical. However it turns out that the diallyl telluride compound is unstable at room temperature, so that storage and handling of this compound is a problem. It might also be thought that the low vapour pressure of diallyltelluride could be compensated by replacing one of the allyl groups with a methyl group. The synthesis of methylallyltelluride is described in GB 2,249,790. Indeed the methylallyltelluride compound does have a very low decomposition temperature (20% decomposed at 300° C. in hydrogen) and is volatile (5.98 Torr at 25° C.) but unfortunately the process leads to highly undesirable by-products and does not yield CMT.

As mentioned above, the synthesis of methylallyltelluride is described in GB 2,249,790. The method disclosed in this document is suitable for the synthesis of other organo telluride compounds having mixed ogano groups. The method involves the reversible reaction of $R_2Te_2$ with $R'_2Te$ to give the compound RR'Te. A problem associated with this synthesis is that, if the boiling points of RR'Te and $R'_2Te$ are similar then the equilibrium of the reaction can not be driven completely to the RR'Te product by distillation. This means that the product is contaminated with the starting materials.

The following items of prior art provide background information, including the disclosure of a synthesis of isopropylallyltelluride, relevant to this application: (a) Mat.

Res. Soc. Symp. Proc. (1989) Vol 131, 69–73, (b) Magn. Reson. Chem. (1995), 33(6), 441–8, and (c) Organometallics (1991), 10(10), 3597-9.

It is an objective of this invention to provide a new method of fabricating MT, CT, and CMT layers and devices that reduces the above mentioned problems associated with the prior art methods.

According to a first aspect, the invention provides a method of depositing $Hg_{1-x}Cd_xTe$ onto a substrate, in a MOVPE technique, where $0 \leq x \leq 1$; comprising the step of reacting together a volatile organotellurium compound, and one or both of (i) a volatile organocadmium compound and (ii) mercury vapour; characterised in that the organotellurium compound is isopropylallyltelluride.

The method of depositing $Hg_{1-x}Cd_xTe$ can be used to fabricate MT, CT, and CMT electronic devices, such devices including solar cell, infrared emitter, and infrared sensing devices. If x=0 then the isopropylallyltelluride is reacted with mercury vapour in the absence of an organocadmium compound, the MOVPE reaction resulting in mercury telluride. If x=1 then the isopropylallyl compound may be reacted with the organocadmium compound in the absence of mercury vapour, the MOVPE reaction resulting in cadmiumtelluride. The fabrication of CT by this method may also be assisted by the presence of mercury vapour.

This method of depositing $Hg_{1-x}Cd_xTe$ is particularly advantageous because the temperature at which the $Hg_{1-x}Cd_xTe$ layer or layers are deposited is low. The method enables the efficient deposition of polycrystalline CdTe. The method also alleviates the production of undesirable by-products and promotes the efficient deposition of MT and CMT.

Preferably the organocadmium compound is an alkyl cadmium compound, more preferably the alkyl cadmium compound is dimethyl cadmium.

Advantageously the substrate comprises one of the materials selected from: glass, glass coated with indium tin oxide, CdTe, CdZnTe, GaAs, GaAs/Si, CdTe/GaAs, CdTe/Si, CdTe/ZnTe/Si, and Si.

The temperature of the substrate during the MOVPE deposition is, preferably, maintained at a temperature in the range 150° C. to 350° C.; more preferably the temperature of the substrate is in the range 250° C. to 300° C.; and yet more preferably the substrate temperature is in the range 150° C. to 300° C.

According to a second aspect, the invention provides a method of fabricating an electronic device comprising the steps of (a) depositing $Hg_{1-x}Cd_xTe$ onto a substrate by the above mentioned method, according to the invention, of depositing $Hg_{1-x}Cd_xTe$; and (b) connecting at least two electrodes to the $Hg_{1-x}Cd_xTe$.

The connection of the electrodes may occur as a result of the deposition of $Hg_{1-x}Cd_xTe$ onto the electrodes or by the deposition of the electrodes onto the $Hg_{1-x}Cd_xTe$.

Preferably the method of fabricating a device further comprises the step of doping the $Hg_{1-x}Cd_xTe$. Advantageously the method of fabricating a device comprises the step of doping the $Hg_{1-x}Cd_xTe$ material in such a manner that a p-n junction is formed. In an alternative aspect the method of fabricating a device comprises the step of growing a passivating layer of CdTe on the $Hg_{1-x}Cd_xTe$.

According to a third aspect the invention provides a device obtainable by the above mentioned method of making a device. According to a fourth aspect the invention provides $Hg_{1-x}Cd_xTe$ or doped $Hg_{1-x}Cd_xTe$ obtainable by the above mentioned method of depositing $Hg_{1-x}Cd_xTe$ by MOVPE. According to a fifth aspect, the invention provides a new organotellurium compound, namely isopropylallyltelluride.

According to a sixth aspect the invention provides a method for the preparation of a tellurium or selenium compound of the formula RaMRb, where M is selenium or tellurium, and where Ra and Rb are different organic groups each independently selected from C1 to C20 alkyl, alkenyl, or aryl; characterised in that the method comprises the step of reacting the compound RaMA, where A is an alkali metal, with the compound RbX, where X is halogen.

An advantage of this method is that the RaMRb is produced at relatively high yields and purities.

Advantageously the method comprises the further step of reacting a compound ARa with M, thereby producing RaMA.

Preferably A is lithium, more preferably X is bromine, yet more preferably M is tellurium.

The invention will now be described, by way of example only, with reference to the following figures.

Figure 3A:
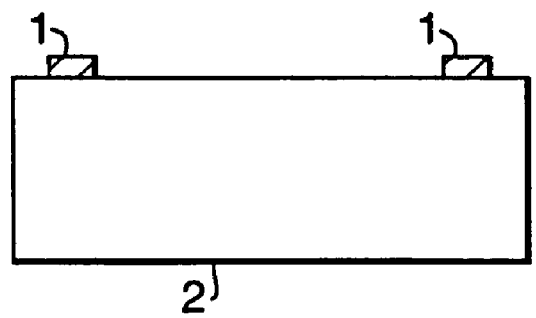

FIGS. 3a, b, and c show three devices according to the invention.

The starting material for the preparation of isopropylallyltelluride was isopropyl lithium prepared by the method disclosed in EP 525 881 A1. A further method by which the isopropyl lithium compound could be prepared is described in the paper by H Gilman et al in J. Am. Chem. Soc. 1941, volume 63, p 2479. Over a period of 2 hours, a precooled (0C) solution of 700 cm$^3$ of $^i$PrLi (2.13 moles dm$^{-3}$ in pentane, 1.49 mole) was added dropwise with vigorous stirring to a cooled (0° C.) suspension of 191.4 g (1.50 mol) of elemental tellurium powder in 1.5 dm$^3$ of THF. On complete addition, the cloudy solution was stirred for a further 1 hour at 20° C.

The $^i$PrTeLi solution was recooled to 0° C. and a precooled (0° C.) solution of 130 cm$^3$ (1.50 mol) of allyl bromide in 100 cm$^3$ of THF was added dropwise over 1.5 hours. The resulting cloudy yellow solution was left to stir at ambient temperature overnight. The bulk of the solvents were removed by distillation under reduced pressure. The final ca. 500 cm$^3$ of volatiles, containing the product, were collected by trap-to-trap distillation in vacuo. The pure product, a clear bright yellow liquid, was obtained by careful fractional distillation at low pressure (ca. 0.2 Torr) through a high efficiency (30 theoretical plate) Spaltrohr® distillation column. Overall yield of pure product=88%.

Figure 1:
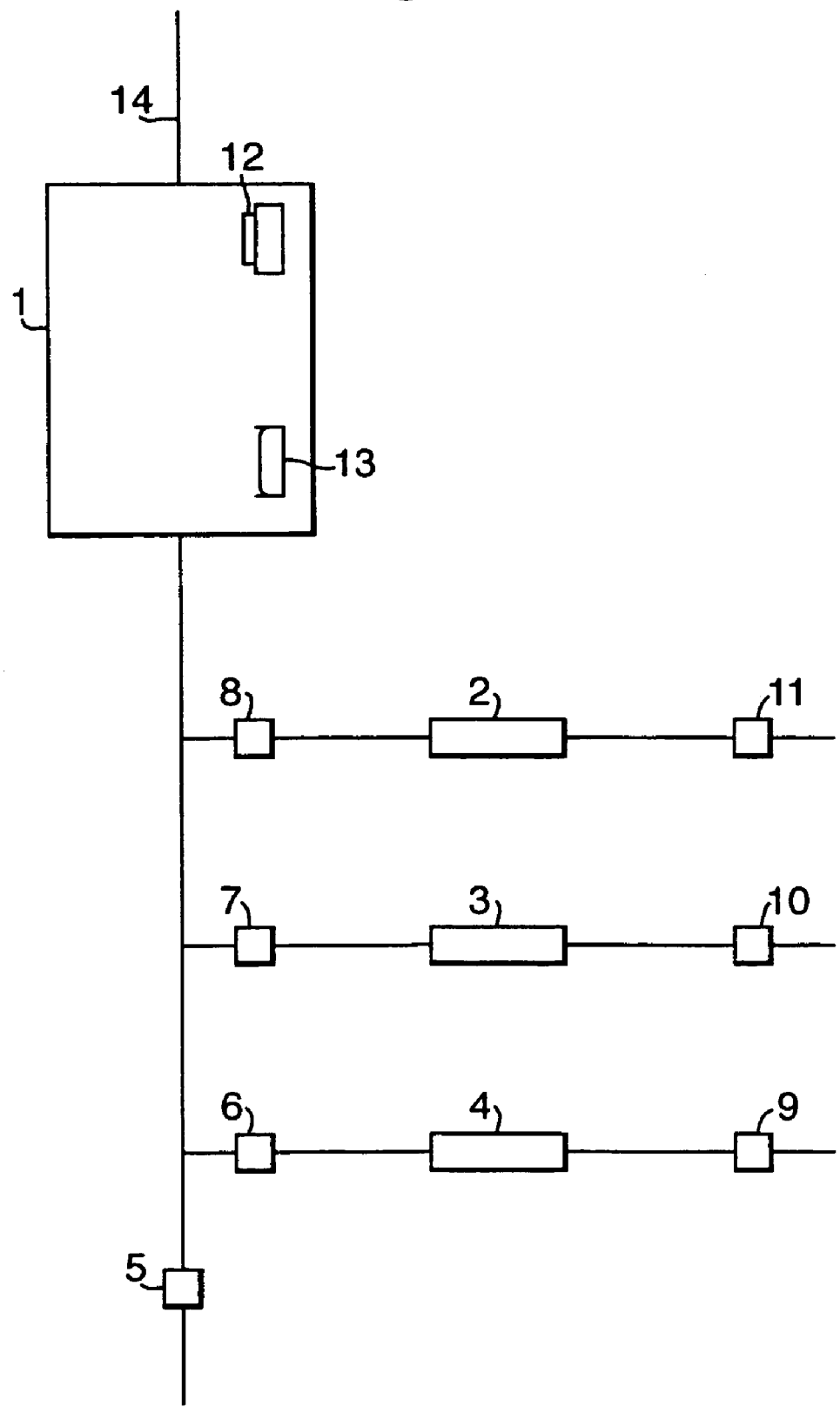
FIG. 1 shows a schematic diagram of an arrangement for fabricating CT, MT, and CMT devices.

A schematic diagram of the apparatus, shown in FIG. 1, is suitable for use in the deposition of a CMT, CT, or MT layer. The apparatus comprises a reaction vessel (1), bubblers (2, 3, and 4) and a number of valves (numbered 5 to 11). Essentially hydrogen is mixed with an organometallic compound or compounds. The mixture of gasses is then flowed over a substrate (12) contained in the reaction vessel (1). The reaction vessel (1) also contains a mercury reservoir (13). Heat is applied to the reaction vessel and to the mercury reservoir as required so that a CMT, MT, or CT layer is deposited upon the substrate (12).

Preparation of a CMT Layer

CMT is grown by the interdiffused multilayer process (IMP) described in GB 2 146 633 B. The process involves the alternate growth of CT and MT. The CT and MT, which are in the form of very thin layers, are then interdiffused to produce CMT. The CT layers can be deposited even in the presence of mercury vapour so that the alternate layers are fabricated simply by interrupting the supply of the organocadmium compound. When the organocadmium compound is present the CT layer is deposited, when it is absent the MT layer is deposited. The value of x in the $Hg_{1-x}Cd_xTe$ produced by the IMP process is determined by the relative thicknesses of the CT and MT layers.

A bubbler (2) contains dimethylcadmium and a second bubbler (3) contains isopropylallyltelluride. Hydrogen is passed through valve (5) and flows towards the reaction vessel. Hydrogen is also passed through the isopropylallyltelluride bubbler (3) by means of valves (7) and (10) and becomes mixed with the organotelluride compound. The hydrogen/organotelluride mixture is diluted by the hydrogen that has passed through the valve (5) and passes into the reaction vessel (1). Valves 8 and 11 are alternately held open and closed. When valves (8) and (11) are open hydrogen passes through the bubbler (2) and becomes mixed with dimethylcadmium. The dimethylcadmium/hydrogen becomes mixed with the other gasses and flows into the reaction vessel (1).

A mercury reservoir (13) and substrate (12) are placed in the reaction vessel (1). The temperature of the vessel wall in the vicinity of the substrate (12) is maintained at a temperature equal to or greater than the mercury vessel temperature. A water cooling jacket (not shown) at one end of the vessel (1) condenses out the unreacted mercury and prevents overheating of the reaction vessel (1). The exhaust vapour stream (14) is then mixed with a further stream of hydrogen and passed through an activated graphite filter to remove unreacted material and by-products.

The partial pressures of the organometallic compounds are controlled by controlling the flow of hydrogen through the valve (5) and through the bubblers (2) and (3). They are also controlled by controlling the temperatures of the bubblers (2) and (3). The apparatus will typically also comprise by-pass lines (not shown in FIG. 1) that allow hydrogen to pass through the apparatus while preventing its flow through the bubblers.

The substrate comprises a buffer layer of epitaxial CdTe grown on (100) GaAs or on (100) GaAs mis-oriented, for example 20 towards either (110) or (111)B.

The isopropylallyltelluride partial pressure was 1.7 Torr during the MT part of the cycle and 1.2 Torr for the CT part of the cycle. The Cd:Te ratio for the CT part of the cycle was 1.6. The MOVPE growth temperature was 300° C. In this way a layer thickness of 4.5 μm was obtained after growth of 25 IMP cycles. It proved possible to vary the composition of the CMT ie x by altering the ratio of the CdTe and HgTe IMP times. The precursor ratios given in this section and in the CT and MT preparation section below are based on an estimated vapour pressure of 1.7 Torr at 25° C. for the isopropylallyltelluride and on a vapour pressure of 36 Torr at 25° C. for dimethylcadmium.

Preparation of a MT and CT Layer

The thicknesses quoted for MT and CT layers described below, were obtained after 20 minutes of growth and were measured by examination of a cleaved edge under a microscope.

The apparatus of FIG. 1 can also be used to fabricate CT and MT layers. For a CT layer or layers the mercury reservoir remains present in the reaction vessel. It is possible to grow the CT with or without the application of heat to the mercury reservoir (13). For an MT layer the flow of hydrogen through the bubbler containing the dimethylcadmium is prevented, so that no dimethylcadmium is present in the reaction vessel. The substrate and buffer layer used also remain unchanged.

Figure 2:
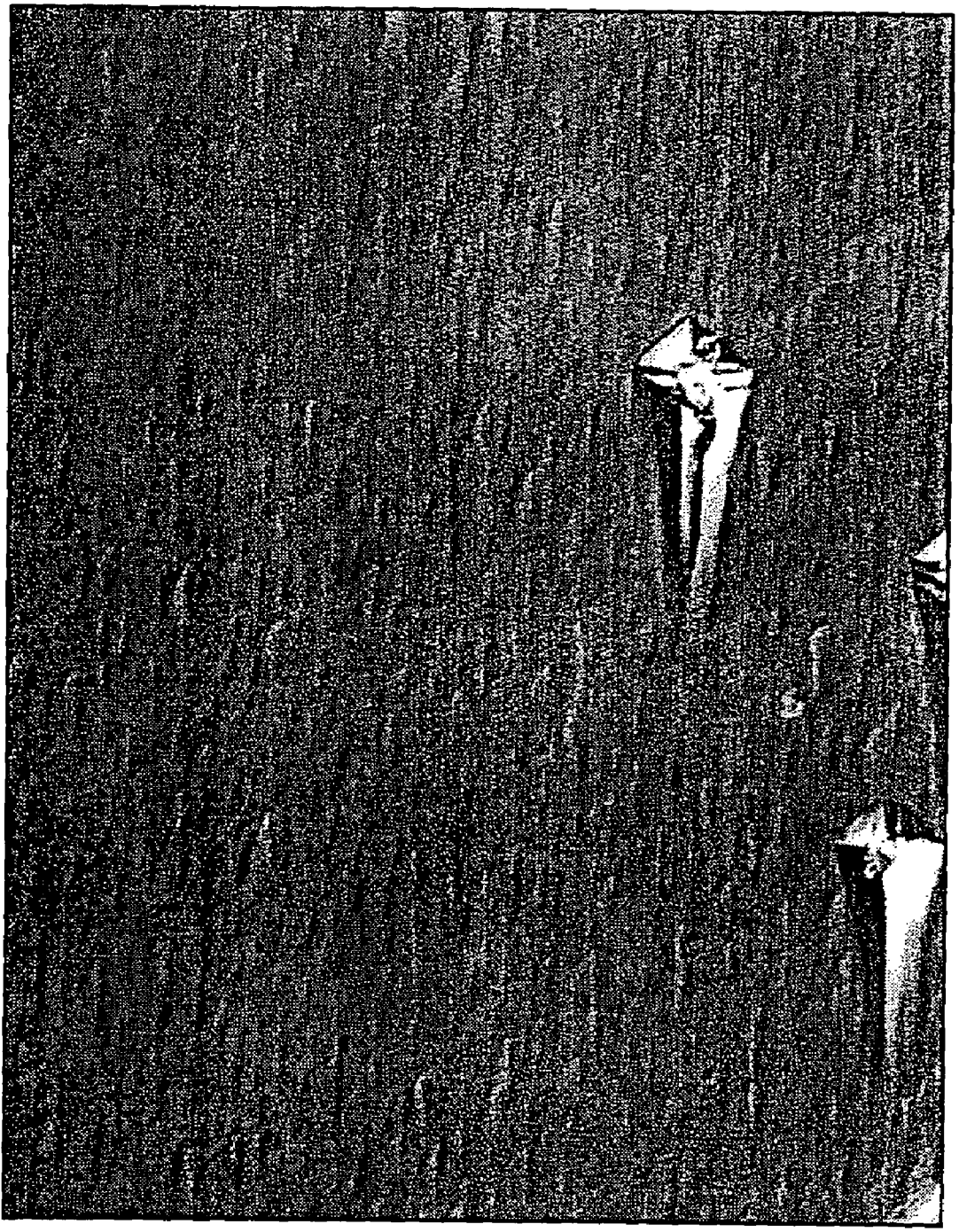
FIG. 2 shows a typical MT layer grown with isopropylallyltelluride.

For the preparation of MT the gas stream in the reaction vessel either had the same composition as that which left the isopropylallyltelluride bubbler or was slightly diluted by passing hydrogen through the valve (5). The growth rate for MT was found to be around 10 μm per hour at MOVPE growth temperatures of 290 to 325° C. An image of the surface of a typical MT layer grown with isopropylallyltelluride is shown in FIG. 2.

For the deposition of CT the $Me_2Cd$:isopropylallyltelluride ratio was varied between 0.26 and 2.7 by varying the $Me_2Cd$ partial pressure between 0.35 and 2.92 Torr. (It should be noted that the 0.26 ratio resulted in no CT being deposited). The partial pressure of the isopropylallyltelluride was held at approximately 1.3 Torr. In this way 2.5 μm thick films of epitaxial CT were grown on top of the conventionally grown CT buffer layer. The MOVPE growth temperature, at which the 2.5 μm thick film was grown, was 325° C. and the ratio of dimethylcadmium to isopropylallyltelluride was 1.6.

Keeping the temperature at 325° C. and increasing the Cd:Te ratio to 2.7 resulted in layers of CT that were very dark grey in colour with an iridescent hue. Examination under the microscope revealed them to consist mainly of coalesced bumps on top of some shinier material. It was concluded that the coalesced bumps were 7 μm of polycrystalline CdTe. The ability to deposit polycrystalline CdTe efficiently at 300° C., perhaps onto glass substrates, may have applications for solar cells.

Dopants

The layer of CMT, MT, or CT grown on the substrate may include one or more dopants. The dopant can be introduced using the apparatus of FIG. 1. The organic compound of the dopant can be held in a bubbler (4) as shown in FIG. 1. The flow of the dopant into the reaction vessel (1) can be controlled by opening or closing the valves (6) and (9). With valves (6) and (9) open hydrogen is bubbled through the bubbler (4) and is mixed with the dopant compound. Alternatively a volatile hydride of the dopant in hydrogen may be used.

Examples of dopants and their hydrides are as follows: Si, Ge, As, and P from their respective hydrides: $SiH_4$, $GeH_4$, $AsH_3$, and $PH_3$. A supply of hydrides eg $SiH_4$ may be supplied direct from gas cylinders. The hydrides may optionally be diluted in hydrogen.

Examples of organic compounds of the dopants are as follows: Al, Ga, As, P, and I from the respective alkyls: $(CH_3)_3\mu l$, $(CH_3)_3Ga$, $(CH_3)_3As$, $(CH_3)_3P$, $C_2H_5'$, and $C_4H_{91}$. A further good source of As is $As(NMe)_3$.

Devices

FIG. 3 shows three electronic devices according to the invention. FIG. 3a shows a layer of semiconductor material (2) connected to two electrodes (1). The layer (2) may comprise CT, CMT, or MT and may be either n-type, p-type, or undoped. The device, shown in FIG. 3a, may form part of an infrared detector.

Such detectors operate by monitoring the change in conductivity of the layer (2) that occurs when the layer is exposed to infrared radiation.

Figure 3B:
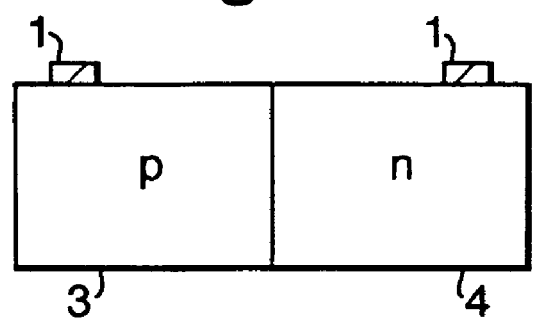
Figure 3C:
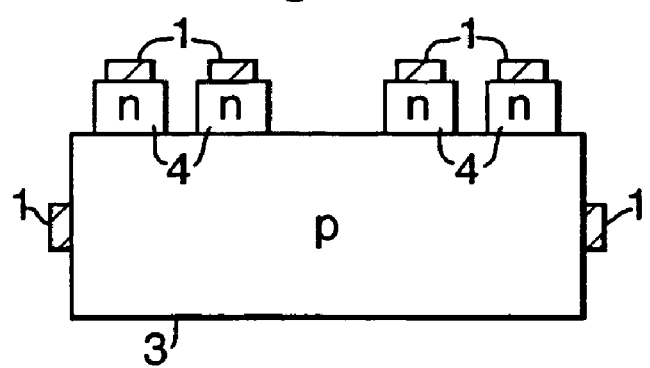

FIGS. 3b and 3c show electronic devices that have one or more n-type regions (4), one or more p-type regions (3), and one or more electrodes (1) connected to the n-type and p-type regions. The n-type and p-type regions may be fabricated from CT, CMT, or MT. The devices of FIGS. 3b and 3c operate by generating a potential difference between the n-type region or regions and the p-type region or regions (3) when the devices are illuminated with electromagnetic radiation. The potential difference can by used to detect the radiation or it can be used as a source of electric power.

The invention claimed is:

1. A method of depositing $Hg_{1-x}Cd_xTe$, where $0<x<1$, onto a substrate, in a MOVPE technique, comprising reacting together isopropylallyltelluride, a volatile organocadmium compound and mercury vapor, wherein $H_{1-x}Cd_xTe$ is grown by an interdiffused multilayer process involving the alternate growth of cadmium telluride and mercury telluride layers, which are then interdiffused to produce $Hg_{1-x}Cd_xTe$, and wherein the substrate is maintained at a temperature in the range 150° C. to 350° C.

2. A method of depositing $Hg_{1-x}Cd_xTe$ according to claim 1 wherein the organocadmium compound is an alkyl cadmium compound.

3. A method of depositing $Hg_{1-x}Cd_xTe$ according to claim 2 wherein the alkyl cadmium compound is dimethyl cadmium.

4. A method of depositing $Hg_{1-x}Cd_xTe$ according to claim 1 wherein the substrate comprises glass, or glass coated with indium tin oxide, or CdTe, or CdZnTe, or GaAs, or GaAs/Si, or CdTe/GaAs, or Si.

5. A method of depositing $Hg_{1-x}Cd_xTe$ according to claim 1 wherein the temperature of the substrate is maintained at a temperature in the range 150° C. to 300° C.

6. A method of depositing $Hg_{1-x}Cd_xTe$ according to claim 5 wherein the temperature of the substrate is maintained at a temperature in the range 250° C. to 300° C.

7. A method of fabricating an electronic device comprising the steps of (a) depositing $Hg_{1-x}Cd_xTe$ onto a substrate by a method according to claim 1; and (b) connecting at least two electrodes to the $Hg_{1-x}Cd_xTe$.

8. A method of fabricating an electronic device according to claim 7 wherein the method further comprises the step of doping the $Hg_{1-x}Cd_xTe$.

9. A method of fabricating an electronic device according to claim 7 wherein the method comprises the further step of doping the $Hg_{1-x}Cd_xTe$ material in such a manner that a p-n junction is formed.

10. A method of fabricating a device according to claim 7 wherein the method further comprises the step of growing a passivating layer of CdTe on the $Hg_{1-x}Cd_xTe$.

11. A method of depositing $Hg_{1-x}Cd_xTe$ according to claim 1, wherein the cadmium telluride layer is deposited in the presence of mercury vapor.

* * * * *